United States Patent
Liu et al.

(10) Patent No.: US 8,779,557 B2
(45) Date of Patent: Jul. 15, 2014

(54) CHIP PACKAGE AND PACKAGE WAFER WITH A RECOGNITION MARK, AND METHOD FOR FORMING THE SAME

(76) Inventors: Tsang-Yu Liu, Zhubei (TW);
Chia-Sheng Lin, Zhongli (TW);
Chia-Ming Cheng, New Taipei (TW);
Po-Shen Lin, Zhongli (TW)

( * ) Notice: Subject to any disclaimer, the term of this patent is extended or adjusted under 35 U.S.C. 154(b) by 0 days.

(21) Appl. No.: 13/476,748

(22) Filed: May 21, 2012

(65) Prior Publication Data

US 2012/0292744 A1    Nov. 22, 2012

Related U.S. Application Data

(60) Provisional application No. 61/488,404, filed on May 20, 2011.

(51) Int. Cl.
*H01L 21/78*    (2006.01)
*H01L 21/68*    (2006.01)
*H01L 23/544*   (2006.01)

(52) U.S. Cl.
CPC ........... *H01L 21/78* (2013.01); *H01L 21/682* (2013.01); *H01L 23/544* (2013.01)
USPC .......................................................... 257/620

(58) Field of Classification Search
CPC ................................ H01L 21/682; H01L 23/544
USPC ............... 257/620, 693, 698, 621, E21.599, 257/E23.011
See application file for complete search history.

(56) References Cited

U.S. PATENT DOCUMENTS

| | | | |
|---|---|---|---|
| 6,407,458 B1 * | 6/2002 | Huemoeller | 257/778 |
| 6,861,742 B2 * | 3/2005 | Miyamoto et al. | 257/693 |
| 6,949,755 B2 * | 9/2005 | Tanaka | 250/491.1 |
| 7,482,700 B2 * | 1/2009 | Hori | 257/787 |
| 7,772,091 B2 * | 8/2010 | Machida | 438/462 |
| 8,304,894 B2 * | 11/2012 | Chia et al. | 257/700 |
| 8,497,575 B2 * | 7/2013 | Yoon et al. | 257/678 |
| 2004/0000744 A1 * | 1/2004 | Grigg et al. | 264/401 |
| 2004/0017013 A1 * | 1/2004 | Yamaguchi | 257/778 |
| 2005/0009298 A1 * | 1/2005 | Suzuki et al. | 438/459 |
| 2005/0023706 A1 * | 2/2005 | Furuya et al. | 257/786 |
| 2005/0208735 A1 * | 9/2005 | Noma et al. | 438/460 |
| 2006/0279003 A1 * | 12/2006 | Maruyama et al. | 257/797 |
| 2008/0023802 A1 * | 1/2008 | Suzuki | 257/620 |
| 2008/0128690 A1 * | 6/2008 | Burnside et al. | 257/48 |
| 2008/0132000 A1 * | 6/2008 | Tsai et al. | 438/113 |
| 2008/0169561 A1 * | 7/2008 | Yamaguchi | 257/737 |
| 2009/0102071 A1 * | 4/2009 | Kindo | 257/797 |
| 2009/0121347 A1 * | 5/2009 | Kasai et al. | 257/729 |
| 2009/0206411 A1 * | 8/2009 | Koketsu et al. | 257/368 |
| 2009/0289319 A1 * | 11/2009 | Sakamoto | 257/434 |
| 2009/0302428 A1 * | 12/2009 | Sakamoto et al. | 257/620 |
| 2010/0171214 A1 * | 7/2010 | Yamaji | 257/729 |
| 2010/0237487 A1 * | 9/2010 | How et al. | 257/690 |
| 2010/0270655 A1 * | 10/2010 | Scheucher et al. | 257/620 |

(Continued)

*Primary Examiner* — Nathan Ha
(74) *Attorney, Agent, or Firm* — Liu & Liu

(57) ABSTRACT

An embodiment of the invention provides a chip package which includes: a substrate, wherein the substrate is diced from a wafer; a device region formed in the substrate; a conducting layer disposed on the substrate and electrically connected to the device region; an insulating layer disposed between the substrate and the conducting layer; and a material layer formed on the insulating layer, wherein the material layer has a recognition mark, and the recognition mark shows position information of the substrate in the wafer before the substrate is diced from the wafer.

20 Claims, 7 Drawing Sheets

(56) References Cited

U.S. PATENT DOCUMENTS

| | | | |
|---|---|---|---|
| 2011/0018124 A1* | 1/2011 | Yang et al. | 257/698 |
| 2011/0079892 A1* | 4/2011 | Tsai et al. | 257/700 |
| 2011/0089581 A1* | 4/2011 | Pol et al. | 257/797 |
| 2011/0097828 A1* | 4/2011 | Konno | 438/16 |
| 2011/0127646 A1* | 6/2011 | Kang et al. | 257/620 |
| 2011/0140267 A1* | 6/2011 | Tsai et al. | 257/737 |
| 2011/0169139 A1* | 7/2011 | Lin et al. | 257/621 |
| 2011/0198732 A1* | 8/2011 | Lin et al. | 257/621 |

\* cited by examiner

CHIP PACKAGE AND PACKAGE WAFER WITH A RECOGNITION MARK, AND METHOD FOR FORMING THE SAME

CROSS REFERENCE TO RELATED APPLICATIONS

This application claims the benefit of U.S. Provisional Application No. 61/488,404, filed on May 20, 2011, the entirety of which is incorporated by reference herein.

BACKGROUND OF THE INVENTION

1. Field of the Invention

The invention relates to a chip package, and in particular relates to a chip package formed by a wafer-level packaging process.

2. Description of the Related Art

In a conventional chip packaging process, semiconductor dies diced from a wafer is one by one packaged, which requires a lot of time and process steps. In a wafer-level packaging process, before the dies are one by one diced, process steps needed to be performed have already been completed on the wafer. After a dicing process is subsequently performed, a plurality of chip packages formed under substantially the same process conditions may be simultaneously obtained. Adopting a wafer-level packaging process may reduce the fabrication cost and time.

However, because a wafer has a larger surface area, packaging processes or fabrication processes of the wafer sometimes needs to be accordingly adjusted. For example, process conditions of portions at the central and periphery portions of the wafer may need to be adjusted.

Thus, it is desired to have relative position information of a single specific chip package in a wafer before being diced, so that the fabrication conditions may be adjusted accordingly thereto.

BRIEF SUMMARY OF THE INVENTION

An embodiment of the invention provides a chip package which includes: a substrate, wherein the substrate is diced from a wafer; a device region formed in the substrate; a conducting layer disposed on the substrate and electrically connected to the device region; an insulating layer disposed between the substrate and the conducting layer; and a material layer formed on the insulating layer, wherein the material layer has a recognition mark, and the recognition mark shows position information of the substrate in the wafer before the substrate is diced from the wafer.

An embodiment of the invention provides a method for forming a chip package which includes: providing a wafer, wherein a plurality of predetermined scribe lines are defined in the wafer, and the predetermined scribe lines define the wafer into a plurality of regions, and a plurality of device regions are formed in the wafer, and the device regions are located in a corresponding one of the regions, respectively; forming an insulating layer on the wafer; forming a plurality of patterned conducting layers on the insulating layer, wherein each of the patterned conducting layers is located in a corresponding one of the regions and is electrically connected to the corresponding device region in the regions, respectively; forming a material layer on the insulating layer, wherein the material layer has a plurality of recognition marks, and the recognition marks are located on a corresponding one of the regions and correspondingly show position information of the regions, respectively; and performing a dicing process along the predetermined scribe lines to form a plurality of chip packages separated from each other.

An embodiment of the invention provides a package wafer which includes: a semiconductor wafer having a plurality of predetermined scribe lines defined therein, wherein the predetermined scribe lines define the semiconductor wafer into a plurality of regions; a plurality of semiconductor devices located in the regions, correspondingly and respectively; an insulating layer located on the semiconductor wafer; a plurality of conducting layers located on the insulating layer, wherein each of the conducting layers is electrically connected to a corresponding one of the semiconductor devices, respectively; and a plurality of recognition marks located on the insulating layer, wherein the recognition marks show relative position information between each of the regions.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a variety of chips. For example, the chip package of the embodiments of the invention may be applied to the package active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power MOSFET modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, the diced package is a chip scale package (CSP). The size of the chip scale package (CSP) may only be slightly larger than the size of the packaged chip. For example, the size of the chip package is not larger than 120% of the size of the packaged chip.

Figure 1A:
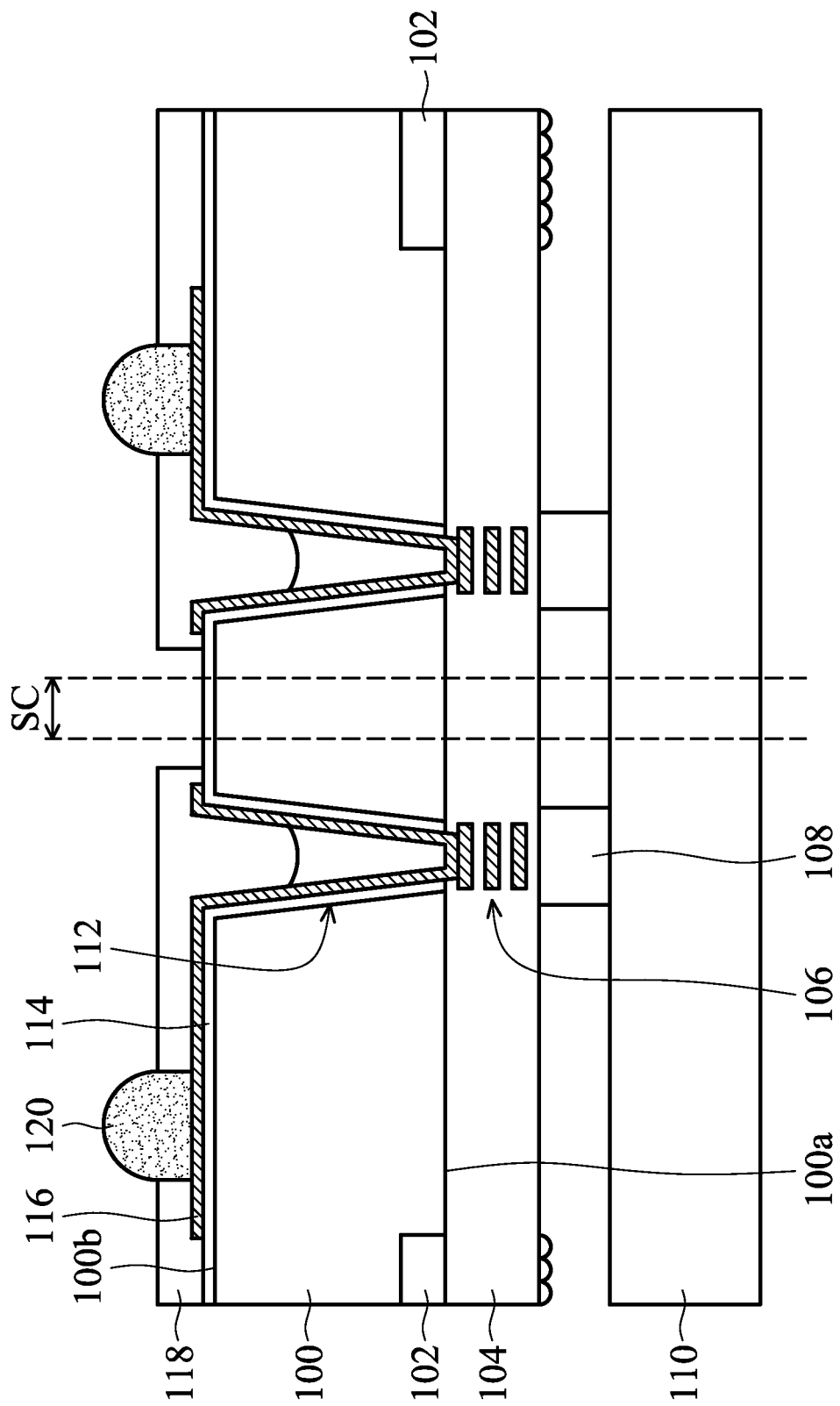
FIGS. 1A-1B are cross-sectional views showing the steps of forming a chip package according to an embodiment of the present invention.
Figure 1B:
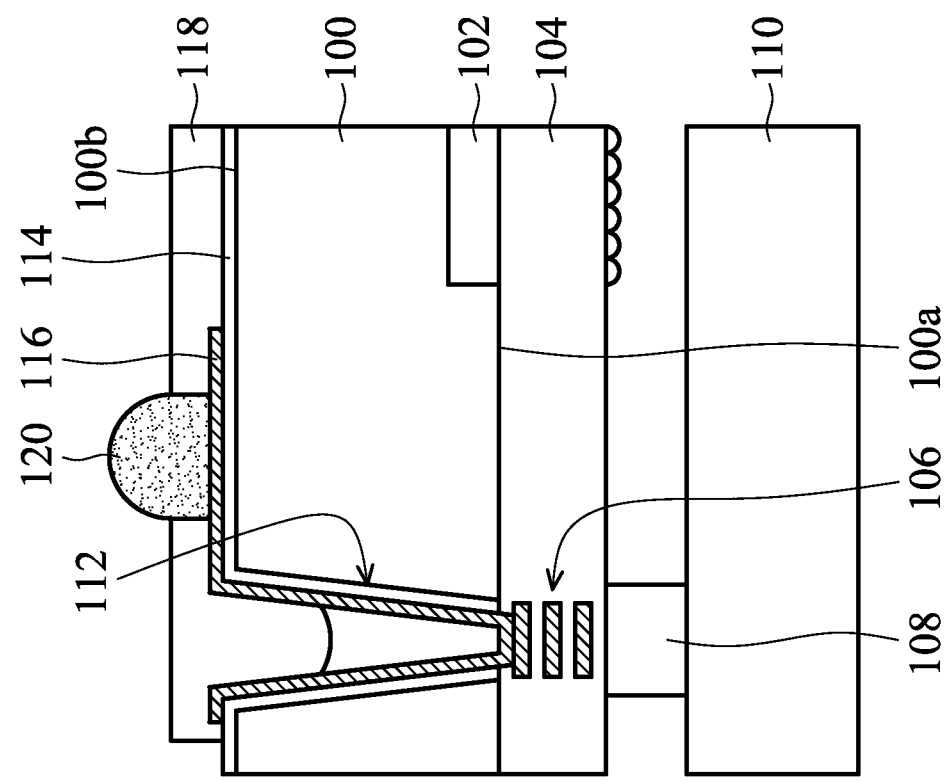

FIGS. 1A-1B are cross-sectional views showing the steps of forming a chip package according to an embodiment of the present invention. In this embodiment, a packaging process of an image sensor chip is taken as an example to illustrate embodiments of the present invention. However, it should be appreciated that embodiments of the invention may also be applied to package another chip.

As shown in FIG. 1A, a substrate 100 is provided. The substrate 100 may be a semiconductor wafer such as a silicon wafer. A plurality of predetermined scribe lines SC may be defined on the substrate 100, which define the substrate 100 into a plurality of regions. After subsequent packaging and dicing processes are performed, each of the regions becomes a chip package. In each of the regions, at least a device region 102 is formed. In one embodiment, the device region 102 may include an optoelectronic device such as an image sensor device or a light emitting device. A plurality of conducting pad structures 106 are formed on a surface 100a of the substrate 100, which are located in an insulating layer 104 (or called a dielectric layer) on the surface 100a. Each of the conducting pad structures 106 may include a plurality of stacked conducting pads. These stacked conducting pads may be electrically connected to each other (through, for example, vertical conducting structures formed between the stacked conducting pads). Alternatively, these stacked conducting pads may not be electrically connected to each other. In one embodiment, at least one of the conducting pads is electrically connected to the device region 102.

Then, a carrier substrate 110 is disposed on the substrate 100. A plurality of spacer layers 108 may be disposed between the carrier substrate 110 and the substrate 100. The spacer layers 108 and the carrier substrate 110 may surround a plurality of cavities on the substrate 100. There may be at least a device region 102 under each of the cavities. The spacer layer 108 may cover the conducting pad structure 106. In the embodiment where the device region 102 includes an optoelectronic device (such as an image sensor device or a light emitting device), and a transparent substrate (such as a glass substrate, quartz substrate, or transparent polymer substrate) may be used as the carrier substrate 100 to help light to enter the device region 102 or to be emitted from the device region 102.

Then, the substrate 100 may be optionally thinned to facilitate proceeding of subsequent processes. For example, the carrier substrate 100 may be used as a support, and the substrate 100 is thinned from a surface 100b of the substrate 100. A suitable thinning process is, for example, a mechanical grinding process or chemical mechanical polishing process.

Next, a portion of the substrate 100 is removed to form a hole 112 extending from the surface 100b of the substrate 100 towards the conducting pad structure 106. For example, a photolithography process and an etching process may be adopted to form the hole 112.

Then, an insulating layer 114 may be formed on the surface 100b of the substrate 100. The material of the insulating layer 114 includes, for example, an oxide, nitride, oxynitride, polymer material, or combinations thereof. The insulating layer 114 may be formed by using a vapor deposition process, thermal oxidation process, or coating process. In one embodiment, the insulating layer 114 is substantially conformally formed on the surface 100b of the substrate 100 and a sidewall and a bottom of the hole 112a.

Then, a portion of the insulating layer 114 located on the bottom of the hole 112 is removed. A portion of the insulating layer 104 is then removed by using, for example, a photolithography process and an etching process such that the conducting pad structure 106 is exposed.

Next, patterned conducting layers 116 are formed on the insulating layer 104 on the surface 100b of the substrate 100. The material of the conducting layer 116 includes, for example, copper, aluminum, nickel, gold, platinum, or combinations thereof. The formation method for the conducting layer 116 may include, for example, a physical vapor deposition process, chemical vapor deposition process, coating process, electroplating process, electroless plating process, or combinations thereof. The conducting layer 116 may extend from the surface 100b of the substrate 100 towards the conducting pad structure 106 along the sidewall of the hole 112 and electrically contact with the conducting pad structure 106.

In one embodiment, a recognition mark may be formed on the insulating layer 104 in each of the regions defined by the scribe lines SC, respectively. The recognition mark includes position information corresponding to the located region. In one embodiment, the recognition mark may be simultaneously formed during the formation of the patterned conducting layers. For example, in one embodiment, a conducting material layer may be formed on the insulating layer 104. The conducting material layer is then patterned to form the conducting layers 116 electrically contacting with the conducting pad structures 106 and the recognition marks. In this case, the recognition mark is composed of the material layer for forming the conducting layers 116. The recognition mark is not electrically connected to the conducting layer 116. In the following description, the purpose of the recognition mark is illustrated.

Next, a solder mask layer 120 is formed on the surface 100b of the substrate 100. In one embodiment, the solder mask layer 120 may have openings exposing the conducting layers 116, and conducting structures 120 such as solder balls may be formed on the exposed conducting layers 116.

Next, the structure shown in FIG. 1A may be diced along the predetermined scribe lines SC to form a plurality of chip packages 10 separated from each other, as shown in FIG. 1B.

Figure 2:
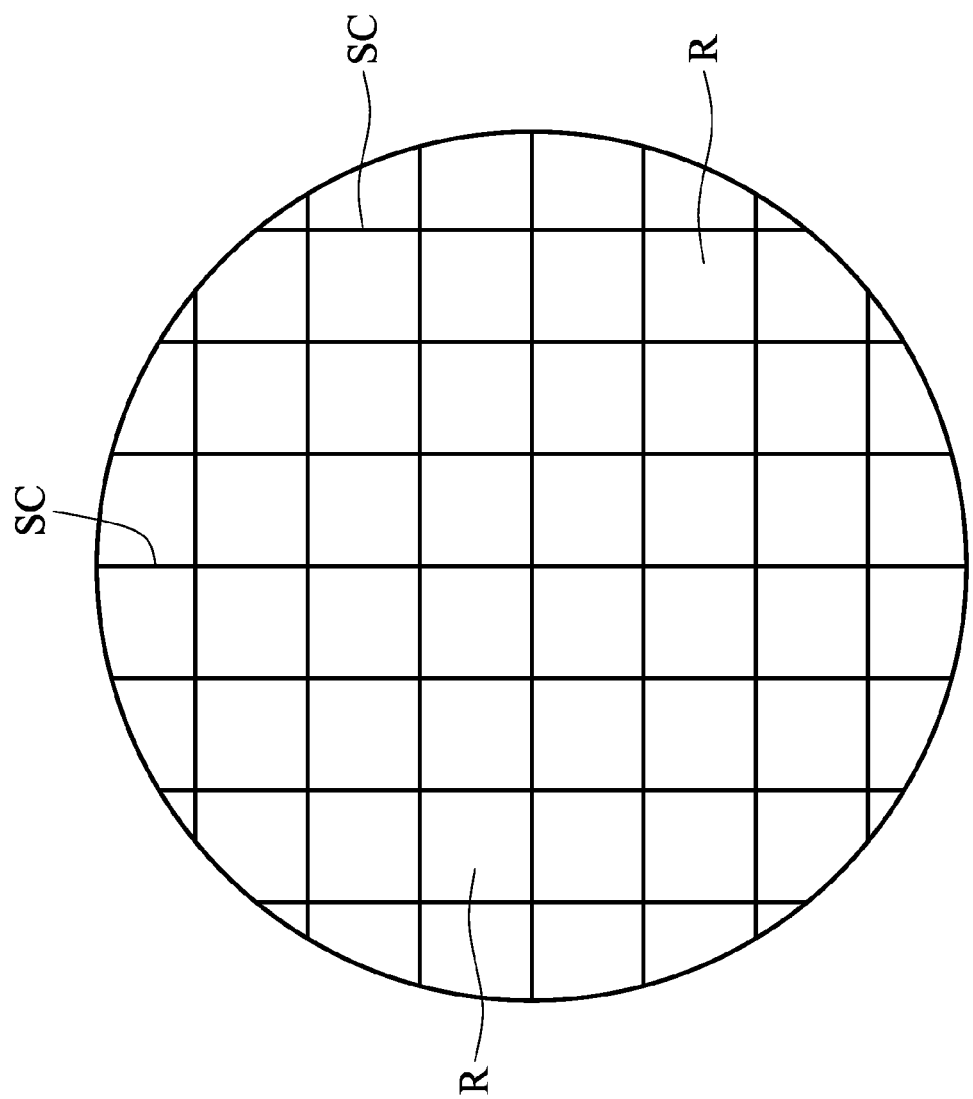
FIG. 2 is a top view showing a package wafer.

Next, the purpose of the recognition marks mentioned above is described. Referring to FIG. 2, a top view of a package wafer is shown, which may correspond to FIG. 1A. As shown in FIG. 2, after the substrate (wafer) 100 is packaged, the substrate may be defined into a plurality of regions R by a plurality of predetermined scribe lines SC. After a dicing process is subsequently performed along the predetermined scribe lines SC, each of the regions becomes a single chip package, such as the chip package 10 shown in FIG. 1B.

After the obtained separate plurality of chip packages are subsequently picked up and/or transported, it is usually difficult to distinguish the original specific position of a specific chip package in the substrate (wafer) 100. Thus, when it is needed to seek the original specific position of a specific chip package in the original wafer, it is difficult to get the desired information. For example, when some chip packages with lower quality are found, it is difficult to find out process problems because the original position information of the chip packages in the package wafer can not be gotten, which causes yield improvement to be difficult.

With regard to the problems mentioned above, the embodiments of the invention propose forming a material layer with recognition marks on the insulating layer. The recognition mark may shows position information of the substrate of a specific chip package in the wafer before being diced from the wafer. In one embodiment, the recognition mark may include encodable and decodable information such as a numeral, a word, a symbol, or combinations thereof. In one embodiment, the position information shown by the recognition mark and may include X axis information and Y axis information.

Figure 3:
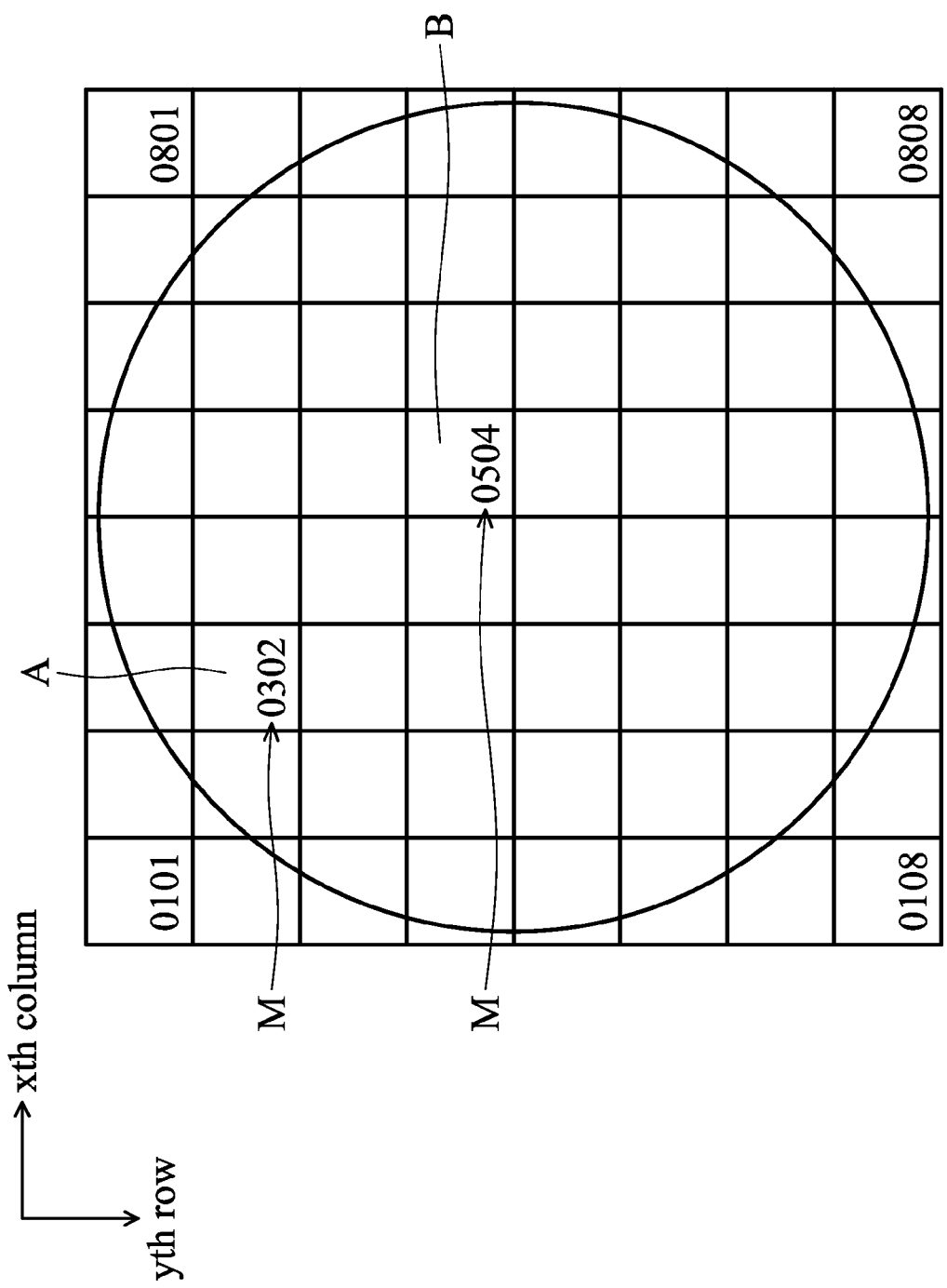
FIG. 3 is a top view showing a package wafer according to an embodiment of the present invention.

FIG. 3 is a top view showing a package wafer according to an embodiment of the present invention. In this embodiment, numerals are used as the recognition mark M. For example, the position A is located in the third column and the second row. Thus, the numeral "0302" may be used as the recognition mark M of the chip package located at the position A, wherein "03" represents the X axis information or column information, and "02" represents the Y axis information and the row information. For example, the position B is located in the fifth column and the fourth row. Thus, the numeral "0504" may be used as the recognition mark M of the chip package located at the position B, wherein "05" represents the X axis information or column information, and "04" represents the Y axis information and the row information. In one embodiment, the recognition mark M and the conducting layers are patterned from a same conducting material layer. Thus, in this embodiment, the formation of the recognition mark M substantially requires no additional process steps.

In the embodiment shown in FIG. 3, a plurality of recognition marks M are formed on the insulating layer, wherein the recognition marks show relative position information between each of the regions.

Referring to FIGS. 1A and 3, the patterned conducting layer 116 may be formed on the insulating layer 114 in each of the regions defined by the scribe lines SC, which may be electrically connected to the corresponding device region 102 in the corresponding region. In addition, a material layer having the recognition mark M may also be formed on the insulating layer 114 in each of the regions defined by the scribe lines SC, which is, for example, a conducting layer having the same material of the patterned conducting layer 116. In one embodiment, the material layer having the recognition mark M is in direct contact with the solder mask layer 118.

FIGS. 4A-4F are top views showing chip packages according to embodiments of the present invention, wherein same or similar reference numbers are used to designate same or similar elements. In one embodiment, the recognition mark M under the solder mask layer 118 may be directly observed by using an optical microscope. In another embodiment, the recognition mark M under the solder mask layer 118 may be observed by using an image sensor, and the position information presented by the recognition mark M may be determined through an image analysis. Thus, the information of the specific location of a specific chip package originally diced from the wafer may be easily obtained through the observation of the recognition mark M.

Figure 4A:
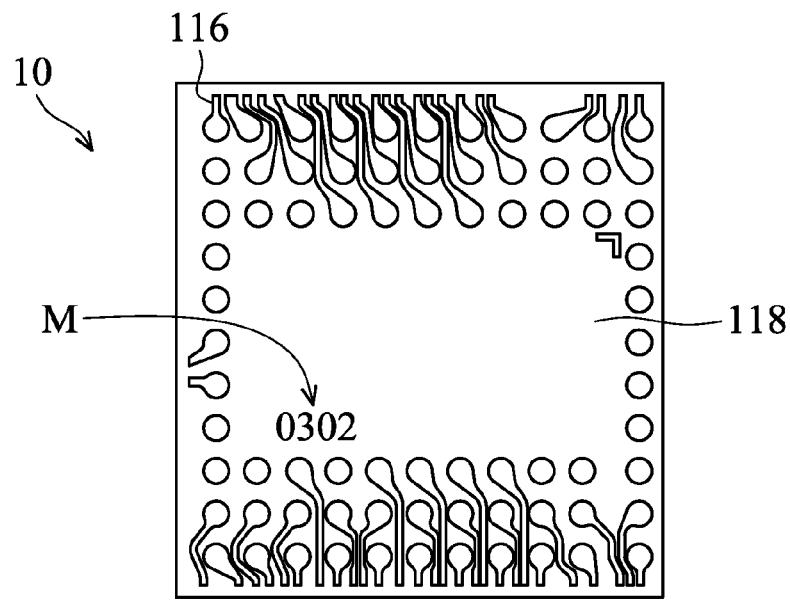
FIGS. 4A-4F are top views showing chip packages according to embodiments of the present invention.

As shown in FIG. 4A, in one embodiment, the recognition mark M may include a plurality of recognizable portions. These recognizable portions may be disposed adjacent to each other. The encodable and decodable information of the recognition mark M is, for example, Arabic numerals. As shown in FIG. 4A, in this embodiment, the recognition mark M may include a first recognize portion "03" and a second recognize portion "02". The first recognize portion is disposed adjacent to the second recognize portion. In another embodiment, the encodable and decodable information of the recognition mark M is, for example, Roman numerals.

Figure 4B:
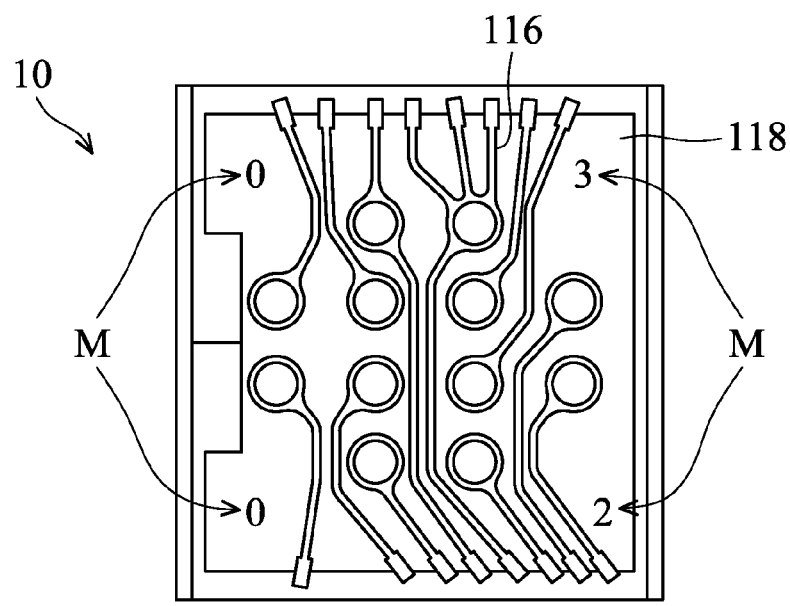

As shown in FIG. 4B, in one embodiment, the recognition mark M may include a plurality of recognizable portions. These recognizable portions may be separately disposed from each other. The encodable and decodable information of the recognition mark M is, for example, numerals. As shown in FIG. 4B, in this embodiment, the recognition mark M may include a first recognize portion "03" and a second recognize portion "02". The first recognize portion and the second recognize portion are separately disposed from each other. In addition, the first recognize portion "03" may further include a sub-portion "0" and a sub-portion "3". The second recognize portion may also include a sub-portion "0" and a sub-portion "2".

Figure 4C:
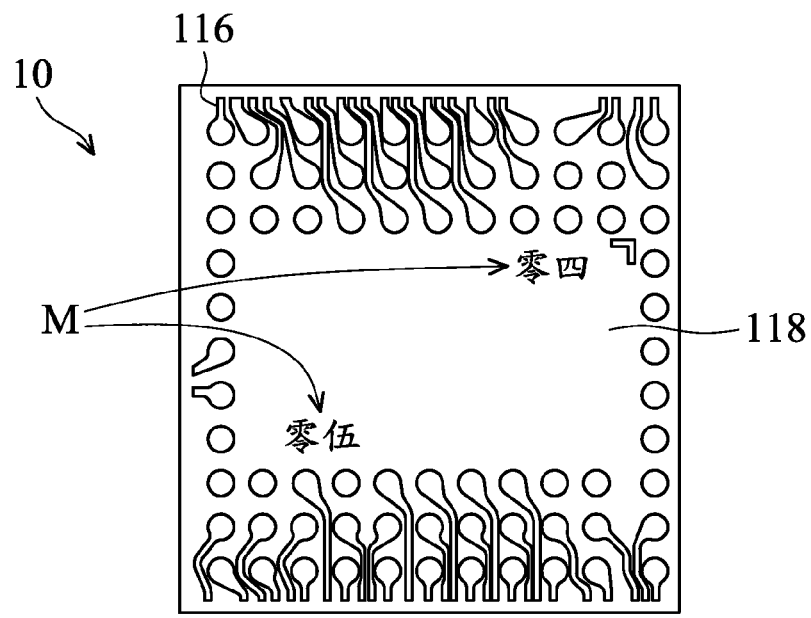

As shown in FIG. 4C, in one embodiment, the encodable and decodable information of the recognition mark M is, for example, words, such as Chinese words, English words, Japanese words, French words, German words, Russian words, and Spanish words. Similarly, the recognition mark M may include a plurality of recognizable portions. These recognizable portions may be separately disposed from each other or adjacent to each other.

Figure 4D:
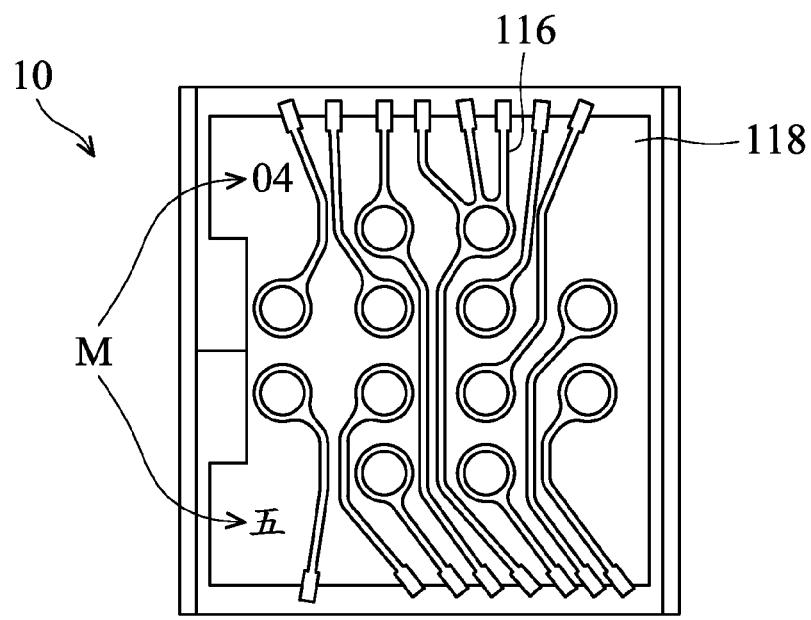

As shown in FIG. 4D, in one embodiment, the encodable and decodable information of the recognition mark is, for example, words, numerals, symbols, or combinations thereof. Similarly, the recognition mark M may include a plurality of recognizable portions. These recognizable portions may be separately disposed from each other or adjacent to each other.

Figure 4E:
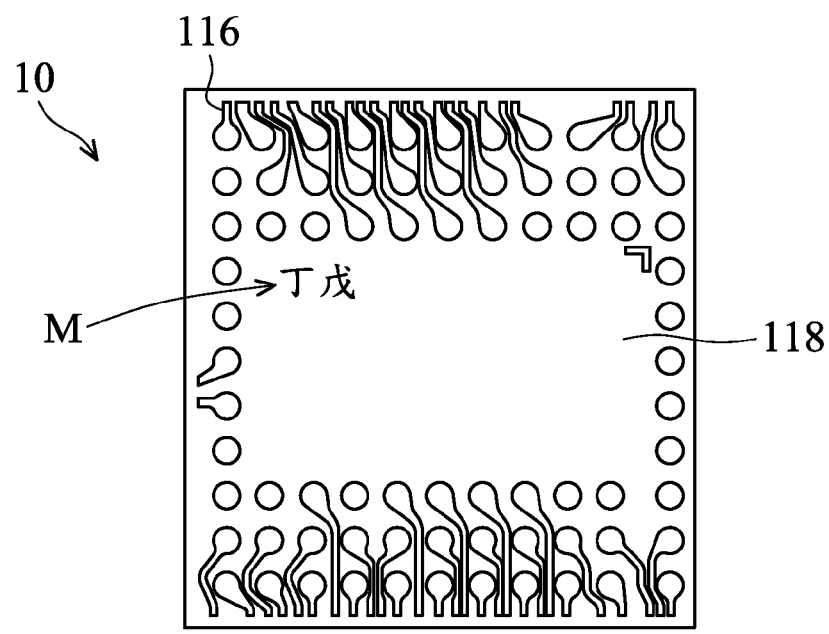
Figure 4F:
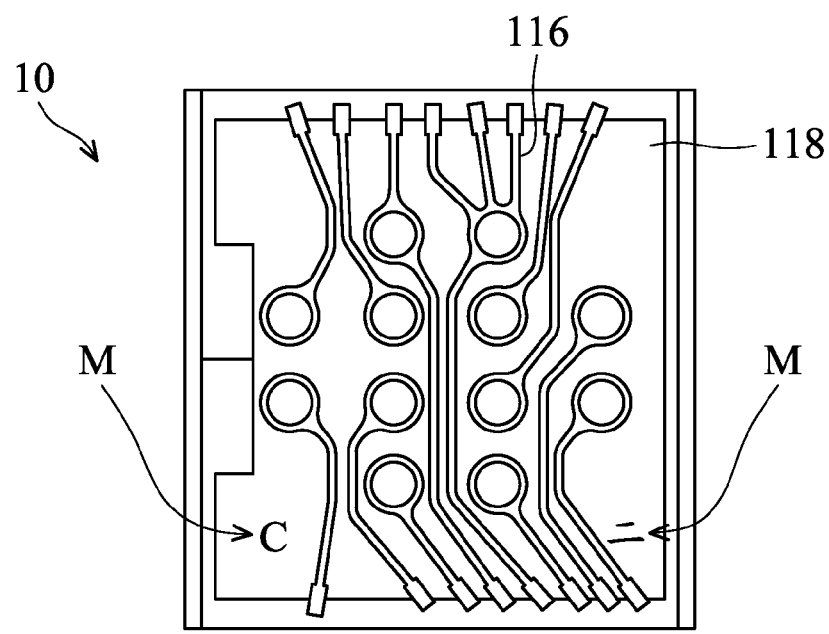

FIGS. 4E-4F are top views showing other possible embodiments. However, it should be appreciated that embodiments of the invention are not limited thereto. Recognition marks which can provide the position information of the chip package in the original wafer are within the scope of the embodiments of the invention. For example, in the embodiment shown in FIG. 4E, "丁" (Chinese word) may represent "04", and "戊" (Chinese word) may represent "05". In the embodiment shown in FIG. 4F, "C" may represent "03", and "二" (Chinese word) may represent "02".

In one embodiment, the encodable and decodable information of the recognition mark may be binary, octal, decimal, or hexadecimal. The recognition mark may be formed at any position on the insulating layer without contacting with the conducting layer and affecting the operation of the chip package.

In the embodiments of the invention, the original position of a specific chip package in the original wafer before being diced may be identified through the disposing of the recognition mark, which helps to find out process problems and improve yield of the chip package. In one embodiment, the recognition marks are simultaneously formed in the patterning process of the conducting layer, which substantially does not increase fabrication cost, but helps to improve the reliability of the products.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
    a substrate, wherein the substrate is diced from a wafer;
    a device region formed in the substrate;
    a conducting layer disposed on the substrate and electrically connected to the device region;
    an insulating layer disposed between the substrate and the conducting layer; and
    a material layer formed on the insulating layer, wherein the material layer has a recognition mark, and the recognition mark shows column information and row information of the substrate in the wafer before the substrate is diced from the wafer.

2. The chip package as claimed in claim 1, wherein the recognition mark comprises encodable and decodable information.

3. The chip package as claimed in claim 2, wherein the encodable and decodable information comprises a numeral, a word, a symbol, or combinations thereof.

4. The chip package as claimed in claim 1, wherein the recognition mark comprises a plurality of recognizable portions.

5. The chip package as claimed in claim 4, wherein the recognizable portions are disposed adjacent to each other.

6. The chip package as claimed in claim 4, wherein at least some of the recognizable portions are separately disposed from each other.

7. The chip package as claimed in claim 1, wherein the column information and row information comprise X axis position information and Y axis position information.

8. The chip package as claimed in claim 1, wherein the material of the material layer and the material of the conducting layer are the same.

9. The chip package as claimed in claim 1, further comprising:
    a solder mask layer disposed on the insulating layer and the conducting layer, wherein the solder mask layer has an opening exposing the conducting layer; and
    a conducting structure formed in the opening and electrically contacting with the conducting layer.

10. The chip package as claimed in claim 9, wherein the solder mask layer directly contacts with the material layer.

11. A method for forming a chip package, comprising:
    providing a wafer, wherein a plurality of predetermined scribe lines are defined in the wafer, and the predetermined scribe lines define the wafer into a plurality of regions, and a plurality of device regions are formed in the wafer, and the device regions are located in a corresponding one of the regions, respectively;
    forming an insulating layer on the wafer;
    forming a plurality of patterned conducting layers on the insulating layer, wherein each of the patterned conducting layers is located in a corresponding one of the regions and is electrically connected to the corresponding device region in the regions, respectively;
    forming a material layer on the insulating layer, wherein the material layer has a plurality of recognition marks, and the recognition marks are located on a corresponding one of the regions and correspondingly show column information and row information of the regions, respectively; and
    performing a dicing process along the predetermined scribe lines to form a plurality of chip packages separated from each other, wherein the recognition mark shows the column information and row information of the chip package in the wafer before the chip package is diced from the wafer.

12. The method for forming a chip package as claimed in claim 11, wherein the materials of the material layer and the patterned conducting layers are the same.

13. The method for forming a chip package as claimed in claim 11, wherein the recognition marks of the material layer and the patterned conducting layers are simultaneously formed.

14. The method for forming a chip package as claimed in claim 11, further comprising:
    forming a solder mask layer on the patterned conducting layers and the insulating layer, wherein the solder mask layer has a plurality of openings exposing the patterned conducting layers; and
    forming a conducting layer on the exposed patterned conducting layers, respectively.

15. The method for forming a chip package as claimed in claim 11, wherein the recognition mark comprises encodable and decodable information.

16. The method for forming a chip package as claimed in claim 15, wherein the encodable and decodable information comprises a numeral, a word, a symbol, or combinations thereof.

17. The method for forming a chip package as claimed in claim 11, wherein the recognition mark comprises a plurality of recognizable portions.

18. The method for forming a chip package as claimed in claim 17, wherein the recognizable portions are disposed adjacent to each other.

19. The method for forming a chip package as claimed in claim 17, wherein the recognizable portions are separately disposed from each other.

20. A package wafer, comprising:
    a semiconductor wafer having a plurality of predetermined scribe lines defined therein, wherein the predetermined scribe lines define the semiconductor wafer into a plurality of regions;
    a plurality of semiconductor devices located in the regions, correspondingly and respectively;
    an insulating layer located on the semiconductor wafer;
    a plurality of conducting layers located on the insulating layer, wherein each of the conducting layers is electrically connected to a corresponding one of the semiconductor devices, respectively; and
    a plurality of recognition marks located on the insulating layer, wherein the recognition marks show relative position information between each of the regions, wherein the recognition marks show column information and row information of each of the regions in the semiconductor wafer before the semiconductor wafer is diced.

* * * * *